(12) United States Patent
Jerebic et al.

(10) Patent No.: US 12,261,153 B2
(45) Date of Patent: Mar. 25, 2025

(54) APPARATUS AND METHOD FOR FORMING A LAYER OF A MATERIAL PROVIDED IN A FLOWABLE STATE ON AN OPTOELECTRONIC LIGHT-EMITTING DEVICE

(71) Applicant: OSRAM OLED GmbH, Regensburg (DE)

(72) Inventors: Simon D. Jerebic, Donaustauf (DE); Daniel Leisen, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 801 days.

(21) Appl. No.: 17/275,078

(22) PCT Filed: Sep. 13, 2019

(86) PCT No.: PCT/EP2019/074454
§ 371 (c)(1),
(2) Date: Mar. 10, 2021

(87) PCT Pub. No.: WO2020/053371
PCT Pub. Date: Mar. 19, 2020

(65) Prior Publication Data
US 2021/0257344 A1    Aug. 19, 2021

(30) Foreign Application Priority Data
Sep. 14, 2018   (DE) .......................... 102018122572.9

(51) Int. Cl.
*H01L 25/075*    (2006.01)
*H01L 25/16*    (2023.01)
(Continued)

(52) U.S. Cl.
CPC ........ *H01L 25/0753* (2013.01); *H01L 25/167* (2013.01); *H01L 33/44* (2013.01);
(Continued)

(58) Field of Classification Search
CPC . H01L 25/0753; H01L 25/1167; H01L 33/54; H01L 33/58; H01L 2933/005; H01L 2933/0058
See application file for complete search history.

(56) References Cited

U.S. PATENT DOCUMENTS 9,978,918 B2    5/2018  Zitzlsperger et al.
10,629,578 B2    4/2020  Leisen et al.
(Continued)

FOREIGN PATENT DOCUMENTS

DE    102013213073 A1    1/2015
DE    102015207533 A1    10/2015
(Continued)

*Primary Examiner* — Marcos D. Pizarro
(74) *Attorney, Agent, or Firm* — Slater Matsil, LLP

(57) ABSTRACT

In an embodiment an apparatus includes a delimiting device and a holding device configured to hold the delimiting device at a distance above an optoelectronic light-emitting device and form a layer of a material provided in a flowable state between the delimiting device and the light-emitting device, wherein a bottom side of the delimiting device, which faces the light-emitting device, has a structuring so that a structure complementary to the structuring is producible on an upper side of the layer.

15 Claims, 5 Drawing Sheets

(51) Int. Cl.
 *H01L 33/44* (2010.01)
 *H01L 33/54* (2010.01)
 *H01L 33/58* (2010.01)

(52) U.S. Cl.
 CPC .............. *H01L 33/54* (2013.01); *H01L 33/58* (2013.01); *H01L 2933/0058* (2013.01)

(56) References Cited

U.S. PATENT DOCUMENTS

| | | |
|---|---|---|
| 10,950,765 B2 | 3/2021 | Pindl et al. |
| 2005/0104164 A1 | 5/2005 | Awujoola et al. |
| 2010/0181582 A1 | 7/2010 | Li et al. |
| 2010/0276716 A1* | 11/2010 | Kwon .................... H01L 33/44 257/E33.061 |
| 2010/0330725 A1 | 12/2010 | Yoshizawa et al. |
| 2012/0097986 A1 | 4/2012 | Ku et al. |
| 2013/0134445 A1 | 5/2013 | Tarsa et al. |
| 2017/0207374 A1 | 7/2017 | Gubser et al. |

FOREIGN PATENT DOCUMENTS

| | | |
|---|---|---|
| DE | 102015112969 A1 | 2/2017 |
| DE | 102016116298 A1 | 3/2018 |
| DE | 102017104851 A1 | 9/2018 |

\* cited by examiner

APPARATUS AND METHOD FOR FORMING A LAYER OF A MATERIAL PROVIDED IN A FLOWABLE STATE ON AN OPTOELECTRONIC LIGHT-EMITTING DEVICE

This patent application is a national phase filing under section 371 of PCT/EP2019/074454, filed Sep. 13, 2019, which claims the priority of German patent application 102018122572.5, filed Sep. 14, 2018, each of which is incorporated herein by reference in its entirety.

TECHNICAL FIELD

The present invention relates to an apparatus and a method for forming a layer of a material provided in a flowable state on an optoelectronic light-emitting device.

BACKGROUND

In the case of optoelectronic light-emitting devices, it may be provided that a material provided in the flowable state, in particular for forming a layer, is applied to at least a specific area of a surface of the optoelectronic light-emitting device.

SUMMARY

Embodiments provide forming a layer of a material provided in a flowable state on a surface of an optoelectronic light-emitting device in a simple manner.

An apparatus according to embodiments of the invention for forming a layer of a material provided in a flowable state on an optoelectronic light-emitting device comprises a delimiting device, in particular a plate-like delimiting device, and a holding device for holding the delimiting device at a certain distance above the light-emitting device for forming the layer between the delimiting device and the light-emitting device.

The layer to be formed can be formed in the space area between a surface of the light-emitting device and the delimiting device arranged above it, from flowable material, such as silicone or epoxy resin, which is brought into the space area from above. The delimiting device can be removed after the material has cured. A partial curing, e.g. for mold stabilization, can also take place using the delimiting device, while curing can take place without the delimiting device.

Since the delimiting device can be arranged at a fixed distance from the surface of the light-emitting device, this results in a precisely defined layer thickness, at least in certain regions. Structures on the upper side of the layer can also be realized, as will be explained below. The delimiting device is preferably designed in the form of a plate. It can be regarded as a kind of upper base plate, on the underside of which, for example, a limiting element can be arranged, which forms a wall and can be used as a lateral boundary for the layer to be formed.

A punctual contact between the delimiting device and the light-emitting device or the upper side of the carrier can also be realized by means of the holding device.

The formed layer can, as mentioned, at least in one region, have a defined height or thickness corresponding to the distance of the delimiting device to the surface of the light-emitting device when the apparatus is arranged as intended for forming the layer above the light-emitting device. Thus, for example, a specific molding height for the originally flowable material can be achieved by means of the apparatus. By means of the apparatus, it is possible in particular to realize layers above optoelectronic semiconductor components of the light-emitting device which have a certain thickness or have a certain structure on their upper side. Such a layer can positively influence the emission properties of the semiconductor components, for example with respect to chromaticity distribution. If the layer is formed, for example, above the emission surface of an optoelectronic semiconductor component, its height can be determined relatively precisely. This means that a relatively narrow chromaticity distribution can be ensured, for example, in the manufacture of white LEDs.

The delimiting device may have at least one opening extending from its upper side to its bottom side, in particular for introducing the material into the space between the delimiting device and the light-emitting device.

The holding device can have at least one spacer. Preferably, the spacer is arranged on the delimiting device and/or an end of the spacer remote from the delimiting device can be brought into contact with the light-emitting device.

A bottom side of the delimiting device facing the light-emitting device when the delimiting device is arranged at the distance above the light-emitting device may have a structuring at least in a region of its bottom side, in particular for forming a structure complementary to the structure on the upper side of the layer of the flowable material.

A bottom side and/or another surface side of the delimiting device can have a non-stick coating. This makes it easier to remove the delimiting device.

Preferably, when the delimiting device is arranged at the distance above the light-emitting device, the region of the bottom side lies above a light-emitting area of an optoelectronic semiconductor component and the structuring is further designed in such a way that an optical element can be formed in the layer above the light-emitting area. The optical element may be a lens.

A bottom side of the delimiting device facing the light-emitting device, when the delimiting device is arranged at the distance above the light-emitting device as intended, may have a first region having a first distance from the upper surface of the light-emitting device and at least a second region having a second distance from the upper surface of the light-emitting device which is different from the first distance. The flowable material can thus be used to form a layer having different heights in different regions. This is advantageous, for example, if encapsulation layers of different thicknesses are to be formed over adjacent optoelectronic semiconductor components, such as LEDs. This allows, for example, different degrees of conversion or color locations to be realized with a converter volume encapsulation. For example, adjacent LEDs can be coated with an encapsulation layer in such a way that "cold" white light is emitted over one LED and "warm" white light over the other LED.

In one variant, sedimentation can take place after volume encapsulation. This can be natural or, for example, forced in a centrifuge. Due to initially different fill levels above a chip, different thicknesses of a sedimented phosphor layer also result. By means of a subsequent grinding process in silicone as a clear component over the sedimented phosphorus, a uniform device thickness above the substrate can be achieved. Another material as clear component is also possible, e.g. epoxy resin.

It may be provided that the flowable material does not cover a first region of the light-emitting device, in particular of an upper side of a carrier of the light-emitting device, and covers a second region of the light-emitting device adjacent to the first region. The delimiting device may be dimensioned to at least substantially cover the second region. The entire second region may thus be provided with a layer that may have a defined height, or may have different defined heights in different regions, and/or may have a defined structure in a region of its upper side.

The apparatus can have a limiting element with a bottom side and at least one lateral surface, wherein, in particular for protecting the first region from the flowable material, the limiting element is designed and can be arranged temporarily on the light-emitting device, in particular on the carrier upper side, in such a way that the bottom side of the limiting element contacts the first region and the lateral surface and/or an edge between the bottom side and the lateral surface delimits the first region from the second region.

The apparatus according to embodiments of the invention can thus also have a limiting element which can be brought with the bottom side on the surface of the light-emitting device, which is in particular the carrier upper side. The bottom side may thereby rest on the surface, and the delimiting device may be dimensioned such that the lateral surface and/or the edge delimits the first region from the second region. The flowable material can then be applied to the second region, whereby the delimiting device prevents— e.g. by the effect of so-called "bleeding"—the flowable material from passing from the second region to the first region and thus wetting it unintentionally. After the material has cured, the delimiting device can be removed. The delimiting device can thus serve as a kind of dam protecting the first region of the surface of the light-emitting device from the material. However, the "dam" is provided only temporarily, as the delimiting device is removed after curing.

The limiting element can be arranged or be arrangeable on the delimiting device, in particular on its bottom side. In particular, the limiting element can be firmly connected to the delimiting device.

The edge can have a course that at least approximately corresponds to a boundary line between the first region and the second region. In this way, the first region can be relatively precisely delimited from the second region and, in particular, slight wetting of the first region can be avoided.

The lateral surface of the limiting element is preferably closed in a circumferential direction, which runs in particular parallel to the bottom side. The lateral surface can therefore form a fully continuous, closed partition wall.

The bottom side and/or the edge of the limiting element can be brought into contact with the light-emitting device, in particular its carrier upper side, over its entire length. In this way, a flow of the material from the second region to the first region can be avoided along the entire boundary line between the first region and the second region.

The bottom side and/or the edge and/or the lateral surface of the limiting element may have a coating, in particular to prevent or limit flow of the material along the limiting element itself.

The lateral surface can comprise a stop device. The stop device on the lateral surface can define a maximum filling height for the material.

The limiting element can be formed at least partially from a deformable and/or elastic material. This allows the limiting element to be pressed onto the surface of the light-emitting device in an improved manner. This results in an improved sealing between the two regions on the surface of the light-emitting device and the upper side of the carrier, respectively.

The lateral surface of the limiting element can run, in particular in a straight line, at an angle of at least approximately 90 degrees to the bottom side or run upwards and outwards away from the bottom side. The lateral surface can also run curved, particularly concave or convex, upwards and outwards. Viewed in a plane perpendicular to the bottom side, the limiting element can have a rectangular, square or triangular cross-section. Other cross-sectional shapes are also possible. The edge between the bottom side and the lateral surface can be rounded. The shape and the course of the lateral surface is reflected in the shape and the course of a lateral surface of the layer formed from the flowable material formed along the lateral surface.

The limiting element can be in the form of a frame-like structure surrounding an inner region, wherein, preferably, the inner region is dimensioned such that at least one optoelectronic semiconductor component, in particular an LED chip, can be accommodated therein, wherein, further preferably, the lateral surface is the surface side of the frame-like structure facing the inner region or the surface side facing away from the inner region. The delimiting device thus allows a layer of the original flowable material to be formed around the semiconductor component. Depending on the dimensions of the delimiting device, the layer can be spaced from the semiconductor component or be flush with it.

The limiting element can be formed in particular in the form of a stamp, the bottom side of which has at least approximately the size and/or shape of the first region. The limiting element can thus be used to cover the first region on the surface of the light-emitting device so that the surroundings of the covered first region can be covered with flowable material without wetting the first region.

Temporarily used components, such as in particular the limiting element or delimiting device, can have a poorly adhering surface or a non-stick coating. Subsequent demolding can thus be facilitated.

Embodiments also provide forming at least one layer on an optoelectronic light-emitting device, comprising the steps:
  providing a carrier, on the upper side of which at least one optoelectronic semiconductor component, in particular an LED chip, is arranged, temporarily placing an apparatus according to any one of the preceding claims on the carrier such that the delimiting device is placed at the determined distance above the upper surface of the carrier, for forming the layer between the delimiting device and the upper surface of the carrier, applying a flowable material to the carrier in the space between the carrier and the delimiting device, and removing the apparatus after the flowable material has cured.

The apparatus can be fixed, in particular clamped, or pressed onto the carrier.

BRIEF DESCRIPTION OF THE DRAWINGS

In the following, embodiments of the invention are explained in more detail with reference to the accompanying drawings.

DETAILED DESCRIPTION OF ILLUSTRATIVE EMBODIMENTS

Figure 1:
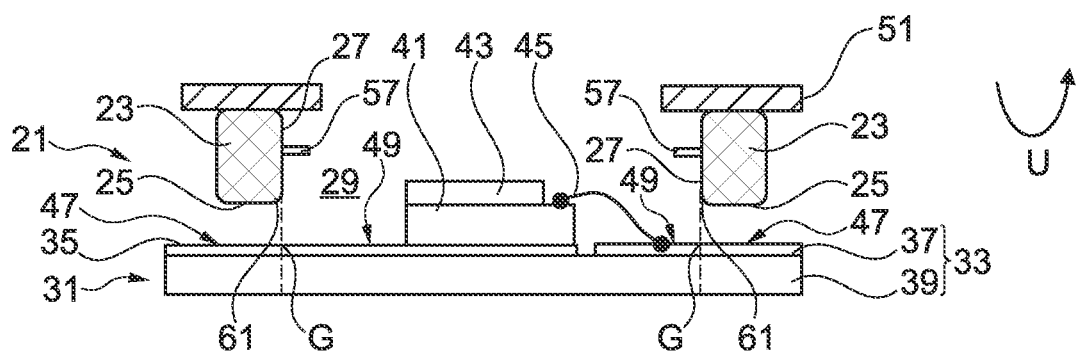
FIGS. 1 to 3 show a respective cross-sectional view of a variant of a temporary delimiting device and an optoelectronic light-emitting device, respectively, illustrating the application of a flowable material.
Figure 2:
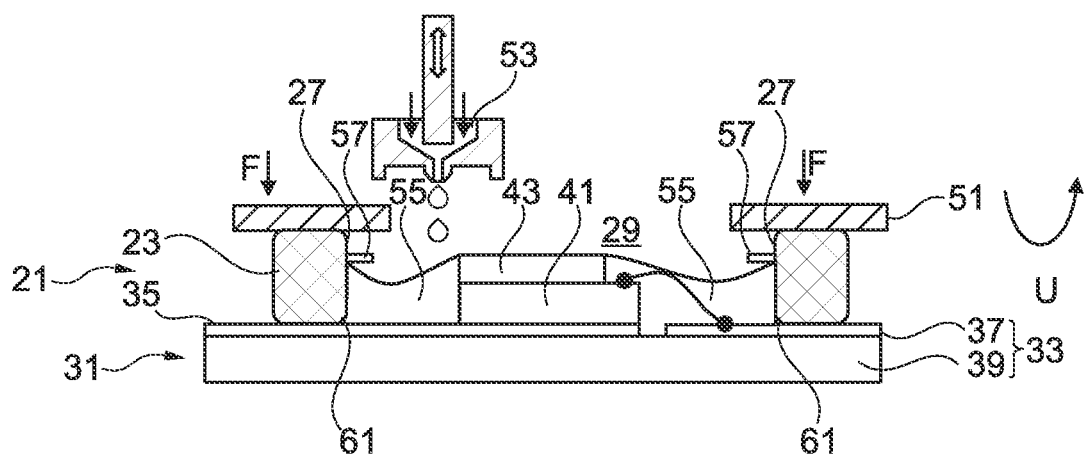
Figure 3:
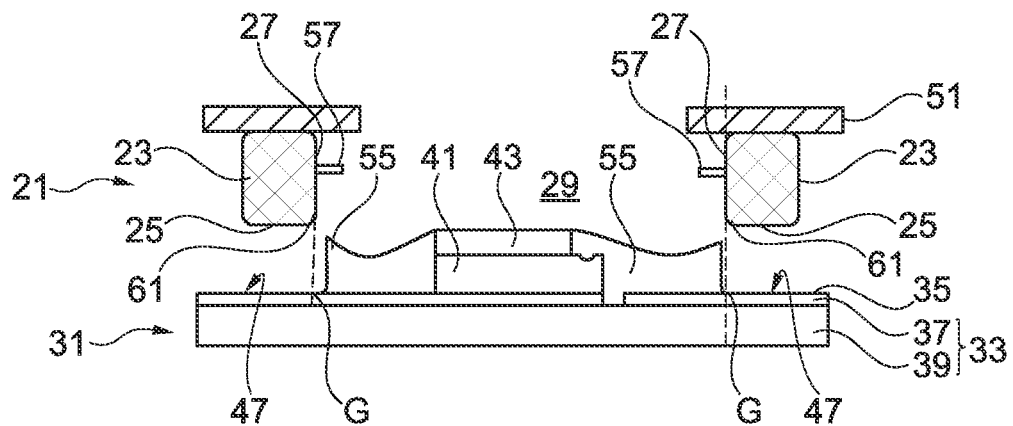

The apparatus 21 shown in FIGS. 1 to 3 comprises a limiting element 23 having a bottom side 25 and at least one lateral surface 27. The limiting element 23 has an at least approximately rectangular cross-section and is preferably formed from a soft, deformable material. In a circumferential direction U extending perpendicularly to the image plane, the limiting element 23 is completely closed. Thus, viewed along its circumferential direction U, the limiting element 23 forms a frame which may, for example, be rectangular or square or even annular in shape. The lateral surface 27 is also, viewed along its circumferential direction U, completely closed. The lateral surface 27 therefore forms a wall surrounding an inner region 29 enclosed by the frame-like limiting element 23.

The delimiting device 21 also has an upper, rigid delimiting device 51, which is in the form of a base plate, on the bottom side of which the limiting element 23 is arranged. The base plate 51 has at least one opening extending from its upper side to its bottom side, through which the inner region 29 is accessible. As a result, at least one flowable material 55, in particular in the form of a layer, can be applied to a plate-like carrier 33 of an optoelectronic light-emitting device 31.

The carrier 33 comprises a substrate 39 and a metallization layer 37, which may be subdivided into individual subregions that are electrically separated from one another. The layer 37 may therefore not be arranged on the entire upper side 35 of the carrier 33, but only on a partial region and therefore have, for example, individual, mutually separated contact areas for electrical contacting.

At least one optoelectronic semiconductor component 41, which may be an LED chip, for example, is also arranged on the upper side 35 of the carrier 33. A light-emitting area is formed on the upper side of the semiconductor component 41, which is covered by an optional, in particular transparent, material layer 43. The semiconductor component 41 can be electrically connected to the metallization layer 37 via at least one bonding wire 45.

In the light-emitting device 31, it is provided that at least one layer of at least one material 55 processed in a flowable state is applied to the upper side 35 of the carrier 33. In this regard, the material 55 is intended to not cover a first region 47 on the upper side 35 of the carrier and to cover a second region 49 on the upper side 35 of the carrier adjacent to the first region 47. The terms "carrier top surface" or "upper side of the carrier" are to be understood broadly, and in particular are intended to include surface areas of elements or devices disposed on the carrier 33. Vertical dashed lines are drawn in FIG. 1 to distinguish the first region 47 from the second region 49. The boundary line G between the two regions 47, 49 further extends in the plane of the upper side 35 of the carrier.

The material 55 is processed in a flowable state and, in particular, applied to the carrier top surface 35. It then cures, for example in a thermal process. The delimiting device 21 is used to apply the material 55 in the flowable state to the upper side 35 of the carrier 33. This one is arranged temporarily on the upper side 35 and removed again after curing or hardening. For this purpose, the lateral surface 27 can, for example, be made of a material with poor adhesion or poor wettability.

In the delimiting device 21, the bottom side 25 and/or the lateral surface 27 and/or an edge 61, which may be rounded, between the bottom side 25 and the lateral surface 27 is/are configured and dimensioned such that, when the bottom side 25 rests on the upper side of the carrier 35, the delimiting device 21 delimits the first region 47 relative to the second region 49.

In particular, the edge 61 extending between the bottom side 25 and the lateral surface 27 has a course along the circumferential direction U which corresponds at least approximately to the boundary line G between the first region 47 and the second region 49 when the bottom side 25 rests on the upper side of the carrier 35. The edge 61 can be brought into contact with the upper side of the carrier 35 along its entire course along the boundary line G. The edge 61 and the lateral surface 27 can thus form a lateral boundary for the material 55 applied to the second region 49 by means of an applicator device 53, as illustrated in particular by FIG. 2. The applicator device 53 can thereby act as a kind of dispenser which dispenses the flowable material 55 via a downwardly directed nozzle, so that the flowable material 55 can be applied to the surface 35 from above (cf. FIG. 2).

The delimiting device 21 can be arranged temporarily on the upper side of the carrier 35, comparable to a stamp, or can be pressed onto the upper side of the carrier 35 with a force F indicated in FIG. 2. The delimiting device 21 can therefore also be regarded as a type of stamp tool. The force F can be generated, for example, by clamping the delimiting device 21 onto the upper side of the carrier 35 or by pressing it onto the upper side of the carrier 35 by means of a corresponding device.

By pressing the delimiting device 21, the region between the edge 61 and the surface 35 can be sealed particularly well, thus preventing the material 55 from flowing over the boundary line G and onto the first region 47. The sealing effect can be further improved by forming the limiting element 23 from a soft, deformable material. Further, a coating may be provided on the lateral surface 27, the bottom side 25 and/or the edge 61 to provide a better seal.

As FIG. 2 further shows, the material 55 may be filled to a desired level laterally adjacent to the wall formed by the lateral surface 27 of the limiting element 23. For this purpose, a stop device 57 may be disposed on the lateral surface 27. This may comprise a plurality of stop elements which protrude from the lateral surface 27 at a certain distance from the bottom side 25 and offset with respect to one another, as viewed in the direction of rotation U. Alternatively, the stop device 57 can also be designed as a circumferential collar protruding from the lateral surface 27. The stop device 57 can be used to prevent the material applied by means of the applicator device 53 from exceeding the height level of the stop device 57 (cf. FIG. 2). At least in the region of the lateral surface 27, a maximum filling level for the flowable material 55 can thus be achieved or ensured by means of the stop device 57. The stop device 57 can have a surface of a weakly adhering material. This can facilitate the removal of the delimiting device 21.

After the material 55 has cured, the delimiting device 21 can be removed again, as FIG. 3 shows. A partial curing, e.g. for mold stabilization, can also be carried out with the delimiting device 21, whereas the material 55 can be cured without the delimiting device 21. A clear delimitation between the uncovered first region 47 and the second region 49 covered with material 55 results. Flowing, also referred to as "bleeding", of the still flowable material 55 into the first region 47 could thus be avoided by using the delimiting device 21. A permanently arranged dam, which could possibly also prevent such "bleeding", could be dispensed with.

Figure 4:
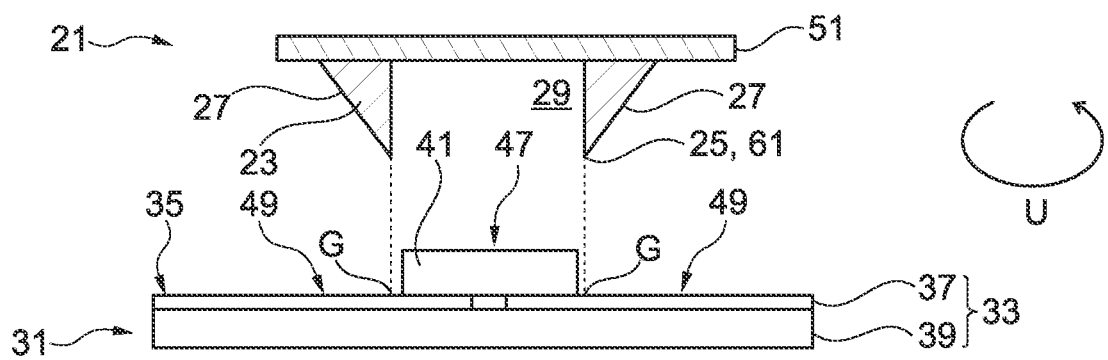
FIGS. 4 to 6 show a respective cross-sectional view of a further variant of a temporary delimiting device or optoelectronic light-emitting device, illustrating the application of a flowable material.
Figure 5:
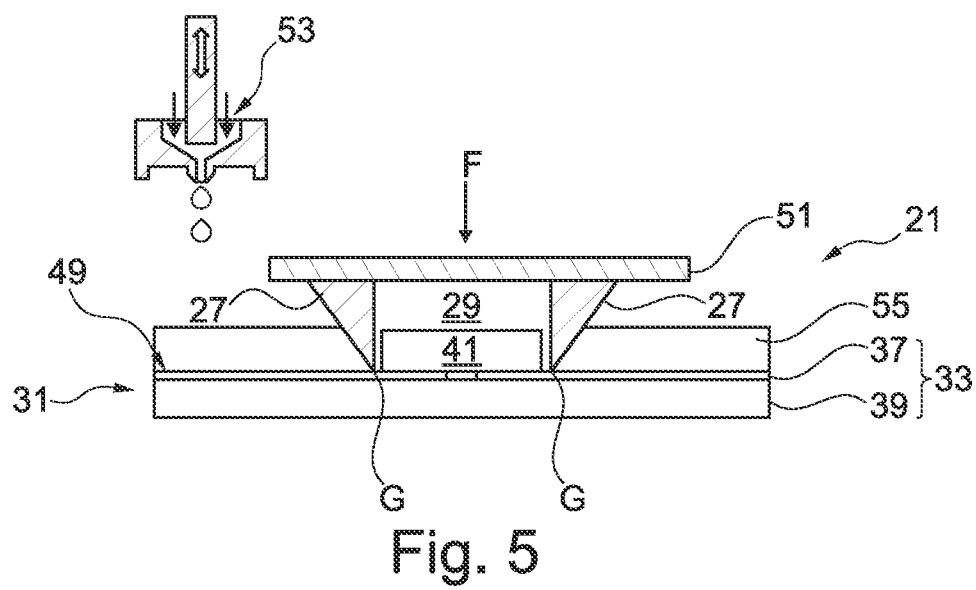
Figure 6:
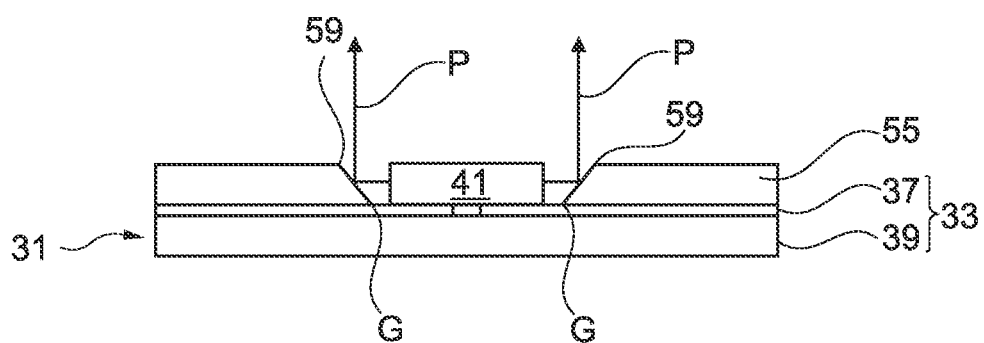

In contrast to the delimiting device of FIGS. 1 and 2, the delimiting device 21 described with reference to FIGS. 4 to 6 has a continuous base plate 51, and the limiting element 23 has a triangular cross-sectional surface. In addition, the lateral surface 27 is on the outside. In the device 21 according to FIGS. 4 to 6, it is therefore provided that the limiting element 23, when brought with its bottom side 25 into contact with the upper side 35 of the carrier 33, covers a first region 47 of the carrier upper side 35 and thus separates it from the adjacent, outer, second region 49.

Due to the triangular cross-sectional shape of the limiting element 23, the bottom side 25 coincides with circumferential edge 61, which runs along the circumferential direction U. The edge 61 is pressed against the upper side 35 by a force F as described above. This rests on the upper side 35 or is pressed onto the upper side 35 with a force F, as previously described. In this way, an effective sealing effect can be achieved and "bleeding" of the flowable material 55 can be avoided. A coating can further improve the sealing effect.

The semiconductor component 41 may be a light-emitting chip that has a light-emitting area on its lateral surface. In particular, the chip can be an LED designed as a volume emitter.

The flowable material 55 can in turn be applied to the second region 49 by means of an applicator device 53, as shown in FIG. 2. The lateral surface 27 extending obliquely upward and outward results in a corresponding bevel 59 on the surface side of the layer formed by the material 55 facing the semiconductor component 41 (cf. FIG. 6). Due to this bevel 59, the material 55 has a defined shape of the flank opposite to the light-emitting area. This can result in improved beam shaping and thus improved decoupling efficiency. This is illustrated in FIG. 6 by the arrows P, which show the light path of the light emitted by the semiconductor component 41 as an example.

The delimiting device 21 described with reference to FIGS. 7 to 9 has a limiting element 23 attached to the base plate 51 which, in contrast to the limiting elements described above, does not have a frame-like structure but is at least approximately in the form of an ellipsoidal, ball-shaped or egg-shaped structure.

Figure 8:
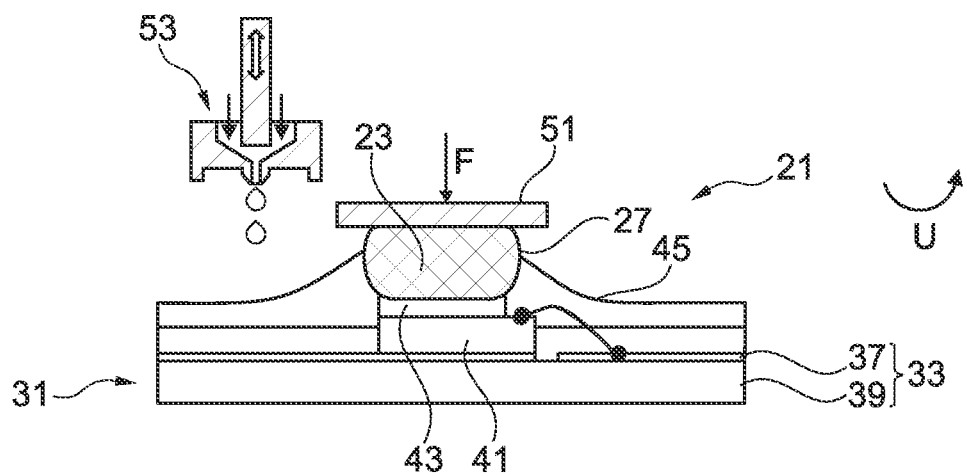

The bottom side 25 of the limiting element 23 can be applied to the upper side of the material layer 43, as shown in FIG. 8. The bottom side 25 is dimensioned to at least approximately cover a light-emitting area of the semiconductor component 41, and thus to protect a defined first region 47 on the upper side 35 of the substrate 33 from material applied in a flowable state. Material layers 55a, 55b formed over the adjacent second region 49 can thus confine the edge of the light-emitting area. Thus, improved contrast in the light emitted from the semiconductor component 41 can be achieved.

The bottom side 25 with the edge 61 running around in the direction of circulation U can in turn be pressed onto the first region 47 with a force F, as described previously. This can provide an effective seal and prevent "bleeding" of flowable material onto the first region 47. A coating may further improve the sealing effect.

Figure 7:
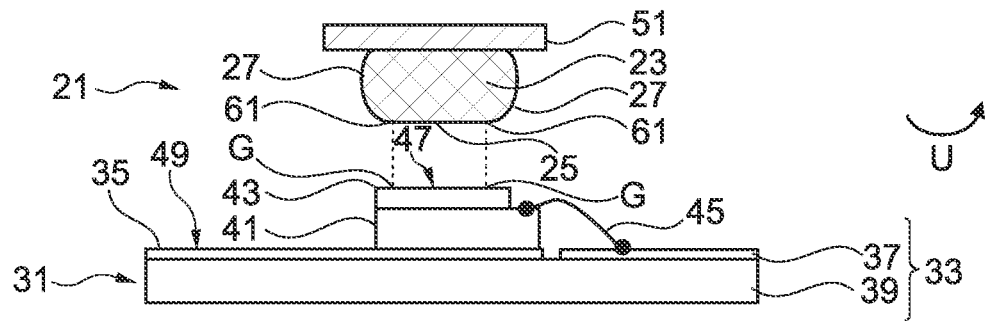
FIGS. 7 to 9 show a respective cross-sectional view of still another variant of a temporary delimiting device or optoelectronic light-emitting device, illustrating the application of a flowable material.
Figure 9:
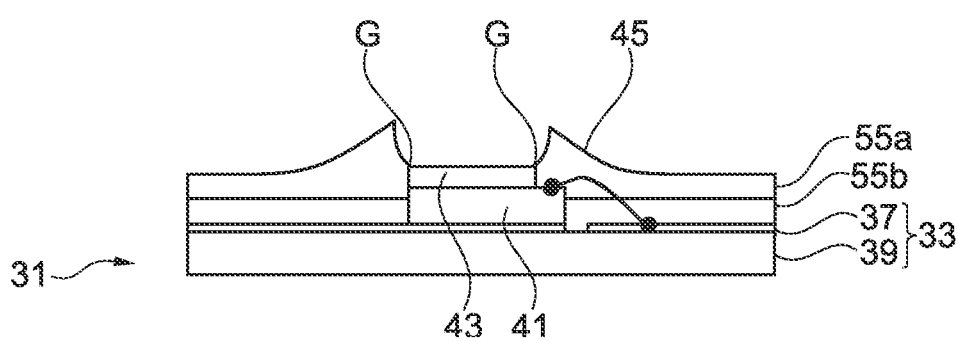

As already mentioned, in the light-emitting device 31 according to FIGS. 7 to 9, it is provided that two layers 55a, 55b of different materials, which are applied in a flowable state by means of the device 53, are applied to the second region 49 of the upper side 35. In this case, the lateral surface 27 of the limiting element 23 forms a boundary wall, running around in the circumferential direction U of the limiting element 23, for the material layers 55a, 55b. These can be formed up to this boundary wall. Due to their shape, as FIG. 9 shows, a kind of crater can be formed laterally above the material layer 43 by the material layers 55a, 55b, in particular if the molding heights are sufficiently high. The crater can improve the beam quality of the light emitted from the semiconductor component 41.

The delimiting device 21 of FIGS. 7 and 8 can again be viewed as a type of stamp that is temporarily arranged to form the layers 55a, 55b and to protect the first region 47 on the upper side of the layer 43. The delimiting device 21 is also applicable for use with screen-printed layers.

Figure 10:
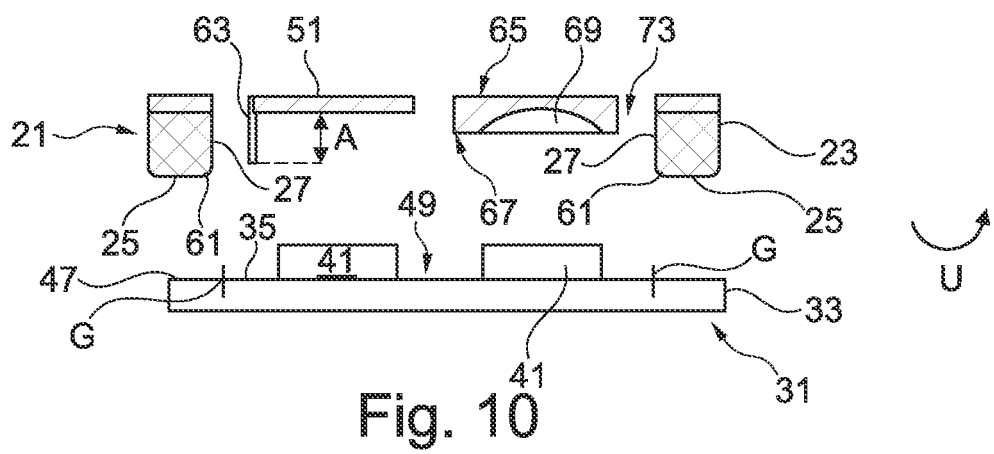
FIGS. 10 to 12 show a respective cross-sectional view of still another variant of a temporary delimiting device or an optoelectronic light-emitting device, illustrating the application of a flowable material, and additionally showing different variants of a delimiting device.
Figure 11:
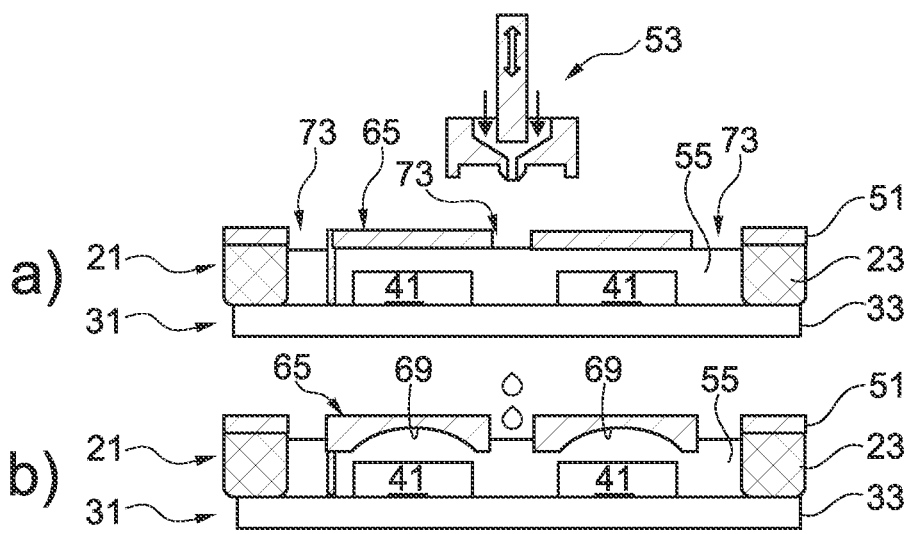
Figure 12:
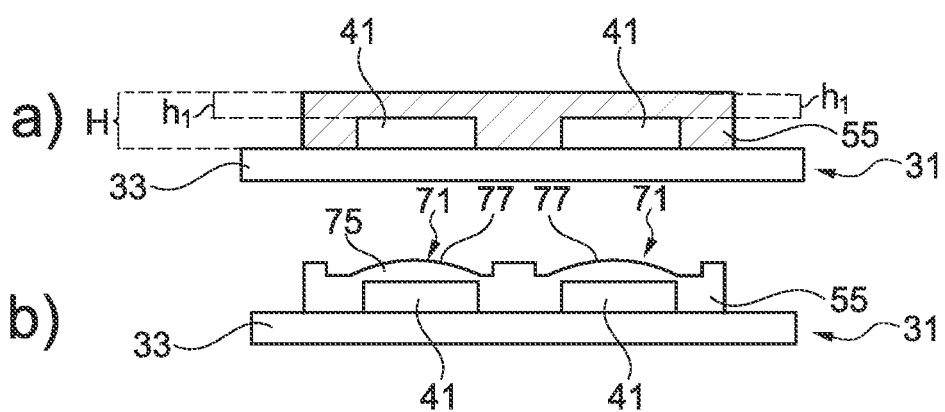

FIGS. 10 to 12 show a temporary delimiting device 21 and an optoelectronic light-emitting device 31, respectively. The device 21 is also suitable for forming at least one defined layer from the material 55 provided in the flowable state. For this purpose, the device 21 has a limiting element in the form of the limiting plate 51 as well as a holding device 63 for holding the limiting plate 51 at a certain distance A above the upper side 35 of the carrier 33 when the device 21 rests on the upper side 35 as intended. The holding device 63 may be in the form of one or more, for example rod-shaped, spacers which are arranged on the limiting plate 51 and whose end remote from the limiting plate 51 lies at a distance A below the limiting plate 51. The holding device 63 is preferably rigidly configured so that it can abut against the upper side 35 when the device 21 is pressed onto the upper side 35.

A limiting element 23 is further arranged on the bottom side of the limiting plate 51, as previously described. However, for the use of the device for producing the at least one layer 55 with a certain height, the limiting element is only to be seen as an optional device.

The limiting plate 51 has openings 73 extending therethrough from its upper side 65 to its bottom side 67, and in particular are provided for introducing the material to form the material layer 55 between the limiting plate 51 and the upper side 35 of the carrier.

As shown in FIG. 11, the device 21 can be brought into contact with the upper side 35 of the carrier 33. FIG. 11 shows two different designs of the limiting plate 51. In the upper part of FIG. 11 (cf. FIG. 11a), the limiting plate 51 is formed with a flat upper side 65 and with a flat bottom side 67. Thus, a layer 55 can be formed from material provided in the flowable state, which is applied via the applicator device 53 and through one of the openings 73, which layer 55 has a defined height H with respect to the upper side of the carrier 35 or a defined height h1 with respect to the upper side of the semiconductor components 41, which may be LED chips, for example.

By using the limiting plate 51 to produce the layer 55 according to FIG. 11a, the height h1 above the semiconductor components 51 is defined, cf. FIG. 12a. The material layer thickness above the emitting component can thus be precisely adjusted. As a result, deviations in the chromaticity distribution can be reduced.

In the lower part of FIG. 11 (cf. FIG. 11b), the limiting plate 51 is indeed also formed with a flat upper side 65. However, the lower side 67 has a structuring 69 provided to form a complementary structure 71 on the upper side 75 of the layer 55, as shown in FIG. 12b. In particular, an optical element 77, in particular a lens, can be formed above the light-emitting area of the semiconductor components 41 in each case.

As further exemplified in FIG. 10, the bottom side 67 of the delimiting device 51 may also comprise a region having a patterning 69 and a flat region.

Figure 13:
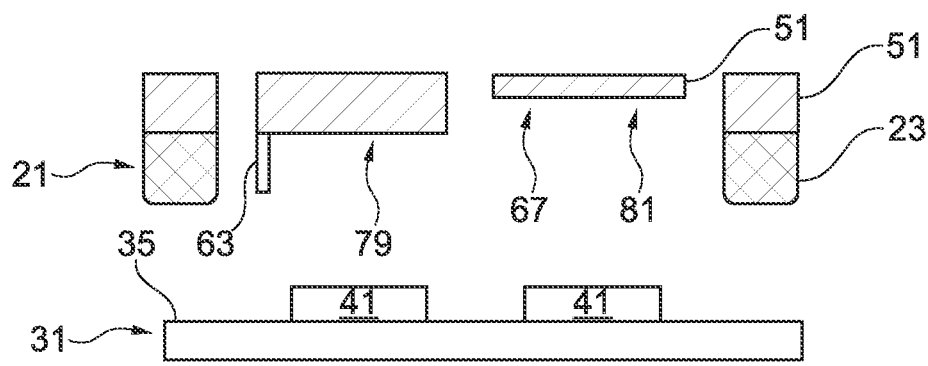
FIGS. 13 to 15 show a respective cross-sectional view of still another variant of a temporary delimiting device or optoelectronic light-emitting device with a carrier, wherein the application of a flowable material is illustrated, and wherein still another variant of a delimiting device for forming a material layer is additionally illustrated.
Figure 14:
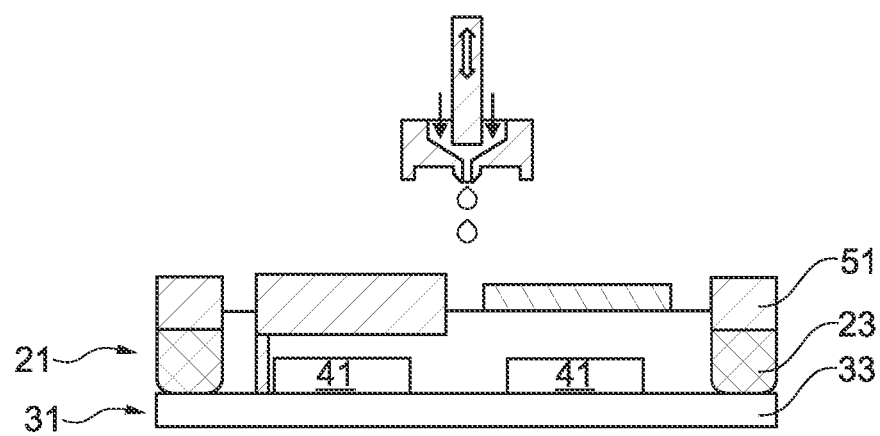
Figure 15:
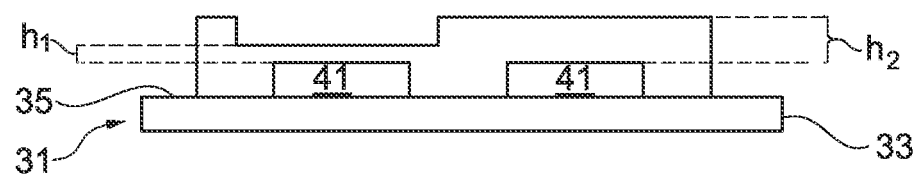

In the example described with reference to FIGS. 13 to 15, a device 21 is used in which the bottom side 67 of the limiting plate 51 is formed in a stepped manner. Thus, the bottom side 67 has at least a first region 79 having a first distance h1 from the upper side of the one semiconductor component 41 and a second region 81 having a second distance h2 from the upper side of the adjacent, second semiconductor component 41 when the device 21 is disposed on the upper side of the carrier 35. As FIGS. 14 and 15 illustrate, a material layer 55 can thus be formed in which the layer heights h1, h2 above the adjacent semiconductor components 41 are different. Different color locations can thus be realized for the semiconductor components 41. This can be used, for example, to realize multiple color location coordinates in a "package".

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An apparatus comprising:
 a delimiting device;
 a holding device configured to:
  hold the delimiting device at a distance above an optoelectronic light-emitting device, and
  form a layer of a material provided in a flowable state between the delimiting device and the light-emitting device; and
 a limiting element with a bottom side and at least one lateral surface, wherein the bottom side of the limiting element is configured to contact a first region of an upper side of a carrier, the light-emitting device with the lateral surface and/or an edge between the bottom side and the lateral surface of the limiting element is configured to delimit the first region with respect to a second region of the upper side,
 wherein a bottom side of the delimiting device, which faces the light-emitting device, has a structuring so that a structure complementary to the structuring is producible on an upper side of the layer,
 wherein the holding device comprises at least one rigid spacer,
 wherein the spacer is arranged on the delimiting device so that an end of the spacer remote from the delimiting device is contactable with the light-emitting device, and
 wherein the limiting element comprises a deformable and/or elastic material.

2. The apparatus according to claim 1, wherein the delimiting device comprises at least one opening passing through it from an upper side to the bottom side, and wherein the opening is configured to introduce the material into a space region between the delimiting device and the light-emitting device.

3. The apparatus according to claim 1, wherein a region of the bottom side of the delimiting device is located above a light-emitting area of an optoelectronic semiconductor component, and wherein the structuring is designed to form an optical element in the layer above the light-emitting area.

4. The apparatus according to claim 1, wherein the bottom side of the delimiting device has at least a first region having a first distance to an upper side of the light-emitting device, and at least a second region having a second distance to the upper side of the light-emitting device, the second distance being different from the first distance.

5. The apparatus according to claim 1,
 wherein the material does not cover the first region of the light-emitting device but covers the second region of the light-emitting device adjacent to the first region, and
 wherein the delimiting device is dimensioned such that the delimiting device at least substantially covers the second region.

6. The apparatus according to claim 1, wherein the limiting element is arranged on the bottom side of the delimiting device.

7. The apparatus according to claim 1, wherein the edge has a course which at least approximately corresponds to a boundary line between the first region and the second region.

8. The apparatus according to claim 1, wherein the lateral surface of the limiting element is closed in a circumferential direction extending parallel to the bottom side of the limiting element.

9. The apparatus according to claim 1, wherein the bottom side and/or the edge of the limiting element can be brought over its entire length into contact with an upper side of the light-emitting device.

10. The apparatus according to claim 1, wherein the bottom side and/or the edge and/or the lateral surface of the limiting element comprises a coating and/or at least one element configured to limit a flow of the material.

11. The apparatus according to claim 1, wherein the limiting element comprises a poorly wettable material.

12. The apparatus according to claim 1, wherein the lateral surface of the limiting element extends at an angle of at least approximately 90 degrees to the bottom side or upwardly and outwardly away from the bottom side of the limiting element.

13. The apparatus according to claim 1, wherein, viewed in a plane perpendicular to the bottom side of the limiting element, the limiting element has a rectangular, square, triangular, n-cornered or circular cross-section.

14. The apparatus according to claim 1,
 wherein the limiting element comprises a frame-like structure surrounding an inner region,
 wherein the inner region is dimensioned such that at least one optoelectronic semiconductor component is placeable therein, and
 wherein the lateral surface is a surface side of the frame-like structure facing the inner region or the surface side facing away from the inner region.

15. A method for manufacturing at least one layer on the optoelectronic light-emitting device, the method comprising:
 providing the carrier with at least one optoelectronic semiconductor component arranged thereon;
 temporarily placing the apparatus according to claim 1 on the carrier such that the delimiting device is arranged at a determined distance above an upper side of a support for forming the layer between the delimiting device and the upper side of the carrier;

applying a flowable material to the carrier in at least a portion of a space between the carrier and the delimiting device; and removing the apparatus after the flowable material has cured.

* * * * *